(12) United States Patent
Park et al.

(10) Patent No.: US 6,762,501 B1
(45) Date of Patent: Jul. 13, 2004

(54) LOW STRESS INTEGRATED CIRCUIT COPPER INTERCONNECT STRUCTURES

(75) Inventors: Young-Joon Park, Richardson, TX (US); Andrew Tae Kim, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/412,900

(22) Filed: Apr. 14, 2003

(51) Int. Cl.[7] .............................................. H01L 23/52
(52) U.S. Cl. .................... 257/765; 257/750; 257/751; 257/762; 257/771; 257/758; 257/748; 257/50; 257/52; 257/543; 257/529; 438/652; 438/653; 438/672; 438/688; 438/669; 438/671; 438/687; 438/612
(58) Field of Search .................... 257/765, 750, 257/751, 762, 771, 758, 748, 50, 52, 543, 529; 438/652, 653, 672, 688, 669, 671, 687, 612

(56) References Cited

U.S. PATENT DOCUMENTS

| | | | | |
|---|---|---|---|---|
| 4,761,677 A | * | 8/1988 | Sasaki | 257/741 |
| 5,358,901 A | * | 10/1994 | Fiordalice et al. | 438/648 |
| 5,393,703 A | * | 2/1995 | Olowolafe et al. | 438/627 |
| 5,572,062 A | * | 11/1996 | Iranmanesh | 257/530 |
| 5,712,510 A | * | 1/1998 | Bui et al. | 257/758 |
| 6,054,770 A | * | 4/2000 | Toyoda et al. | 257/762 |
| 6,090,710 A | * | 7/2000 | Andricacos et al. | 438/687 |
| 6,133,635 A | * | 10/2000 | Bothra et al. | 257/758 |
| 6,420,254 B1 | * | 7/2002 | Stamper et al. | 438/612 |
| 6,545,362 B2 | * | 4/2003 | Moriya et al. | 257/765 |
| 2003/0089996 A1 | * | 5/2003 | Hau-Riege | 257/774 |

* cited by examiner

Primary Examiner—Matthew Smith
Assistant Examiner—Victor Yevsikov
(74) Attorney, Agent, or Firm—Peter K. McLarty; W. James Brady, III; Frederick J. Telecky, Jr.

(57) ABSTRACT

Isolated metal structures (110), (140) are formed adjacent to terminated metal lines (100), (130) that are connect by a via (120). The isolated structures (110), (140) act to suppress the stress created in the terminated metal lines (100), (130) during thermal cycling.

11 Claims, 3 Drawing Sheets

LOW STRESS INTEGRATED CIRCUIT COPPER INTERCONNECT STRUCTURES

FIELD OF THE INVENTION

The invention is generally related to the field of integrated circuits and more specifically to a structure and method for reducing the stress in copper interconnect structures.

BACKGROUND OF THE INVENTION

Copper is increasingly being used to form the metal interconnect lines in integrated circuits. Typically, dielectric layers are formed above the semiconductor surface and the copper metal lines are embedded in the dielectric layers using a damascene type process. Currently most of the dielectric layers in which the copper metal lines are formed comprise silicon dioxide. Silicon dioxide is a fairly rigid dielectric material with a dielectric constant of about 3.9.

A major limitation in the operating speed of an integrated circuit is the resistance/capacitance (RC) delays introduced by the resistance of the metal interconnect lines and the capacitance that exists between the various metal lines and the intervening dielectric layers. The use of copper has lead to a reduction in the resistance of the lines compared to some of the previously used materials such as aluminum. The reduction in the capacitance of the copper interconnects is being accomplished by replacing the silicon dioxide dielectric with low k dielectric materials (i.e. materials that have a low dielectric constant). Some of these low dielectric constant materials include organosilicate glass (OSG). In addition to the difference in dielectric constant the low k dielectric materials are 'softer' and more flexible that the higher dielectric constant silicon dioxide film.

During integrated circuit formation existing copper lines are often subject to thermal cycles that cause the copper lines to expand. In the case where the rigid high dielectric constant silicon oxide is used, the mechanical strength of the silicon oxide is enough to suppress copper expansion and thus, reduce the tensile stress that is produced in the copper. For the case of the 'softer' low k dielectric layers however the copper expands more freely and large tensile stress is produced in the copper lines. This tensile stress has been treated as having mainly hydrostatic components and is most severe in regions of the copper line/dielectric layer structure where asymmetries exist. Such a situation is shown in FIG. 1. A dielectric layer 20 is formed over a semiconductor and/or additional layers 10. A copper metal interconnect 50 is formed in the dielectric layer using standard processing methods. A second dielectric layer 30 is formed over the first dielectric layer 20 and a second copper metal line 60 and a via 70 is formed in the second dielectric layer 30. The via is a conductive interconnect that connects the copper metal interconnect lines 50 and 60. A third dielectric layer 40 is formed above the second dielectric layer 30 as shown in the Figure. The asymmetry of the structure is clearly seen in the Figure. During thermal cycling, such as that produced during the formation of the additional layers, the copper lines 60 and 50 will expand and move in a direction given by 80. The rotational movement of the lines 50 and 60 is caused by the via which ties the lines 50, 60 together and prevents the lines 50, 60 from expanding in a straight line. As the lines 50, 60 move during the thermal cycle voids and/or cracking induced faults 90 are formed in regions of high stress. These voids and/or cracking induced faults 90 can lead to reduced process yield and actual device failure. A method and/or structure is therefore needed to prevent the formation of voids and/or cracking faults in asymmetric copper interconnect lines. The instant invention addresses this need.

SUMMARY OF THE INVENTION

The instant invention results in low stress copper metal interconnect structures in integrated circuits. In particular isolated metal structures are formed adjacent to the ends of terminated metal lines connected by a via. The terminated metal lines represent different levels of metallization and are connected by the via at a position adjacent to the end of each terminated line forming an asymmetric metal structure. The isolated metal structures are formed on the same axis as the adjacent metal lines at distance of less than 0.5 um from the end of each terminated line.

Figure 1:
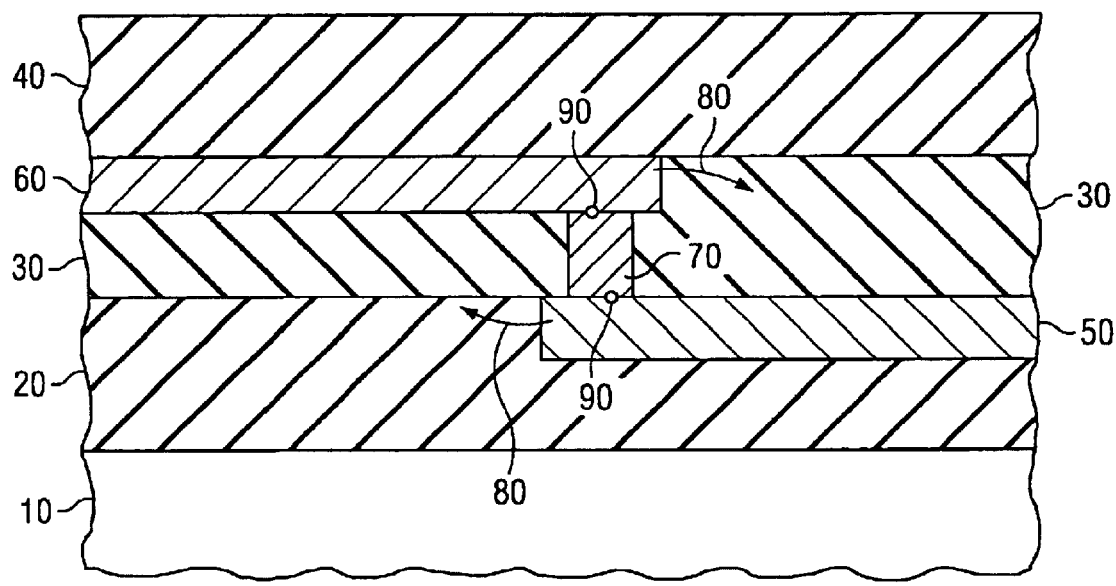
FIG. 1 is a cross-sectional diagram showing the formation of voids in asymmetric copper interconnects according to the prior art.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–4, the instant invention can be utilized in any semiconductor device structure. The methodology of the instant invention provides a solution to formation of copper interconnect lines and structures without the formation of voids and/or cracking faults.

Figure 2A:
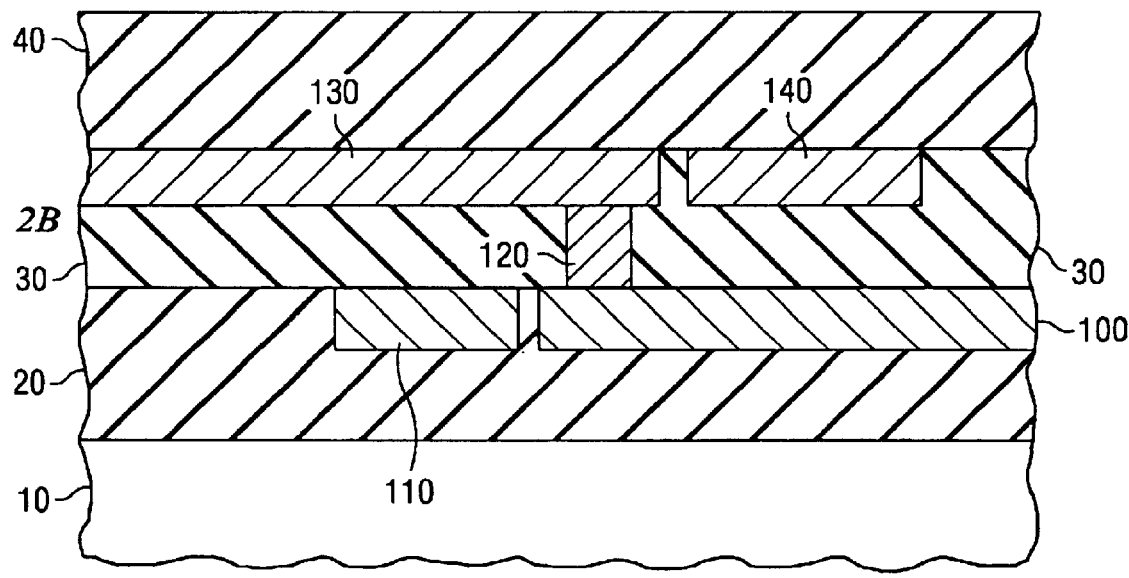
FIG. 2(a) is a cross-section diagram showing an embodiment of the instant invention.

Shown in FIG. 2(a) is a first embodiment of the instant invention. A first low k dielectric layer 20 is formed over a semiconductor and/or other intervening layers 10. In an embodiment the low k dielectric 20 can comprise siloxane, silsesquioxanes, cage silsesquioxanes, xerogels, organosilicate glass and other suitable low k dielectric materials. In general a low k dielectric can be described as a dielectric material with a dielectric constant of less than 3.8. The semiconductor 10 will contain electronic devices that will be interconnected by copper metal lines to form the integrated circuit. Above the surface of the semiconductor any number of additional layers can be formed between the surface of the semiconductor and the first low k dielectric layer 20. A copper metal interconnect line 100 is formed in the low k dielectric and an isolated symmetric copper termination structure 110 is formed adjacent to the copper interconnect line 100. The isolated symmetric copper termination structure 110 is formed on the same axis as the copper interconnect line 100 and is separated from the copper line 100 by distances that are less than 0.5 um. The symmetric structure 110 is isolated in the sense that no current will flow through the symmetric termination structure during the operation of the integrated circuit. The symmetric copper termination structure 110 will function to reduce the stress created in the copper interconnect line 100. A second low k dielectric layer 30 is formed above the first low k dielectric layer 20. In an embodiment the second low k dielectric 30 can comprise siloxane, silsesquioxanes, cage silsesquioxanes, xerogels, organosilicate glass and other suitable low k dielectric materials with dielectric electric constants less than 3.8. A second copper interconnect line 130 is formed in the second low k dielectric layer and a second symmetric isolated copper termination structure 140 is formed on the same axis as the second copper interconnect line 130. The second isolated symmetric copper termination structure 140 will function to reduce the stress created in the second copper interconnect line 130 and is separated from the second copper interconnect line by a distance that is less than 0.5 um. The first copper interconnect line 100 and the second copper interconnect line 130 are interconnected by a via structure 120. It should be noted that the first copper line 100, the via 120, and the second copper line 130 form an asymmetrical interconnect structure. The isolated symmetric copper termination structures 110 and 140 function to suppress the thermal stress created in the asymmetric structure during thermal cycling thereby reducing and/or eliminating the creation of voids and/or cracking faults as described above. In general an asymmetric copper interconnect structure will be formed when copper metal interconnect lines from two different metal levels such as the $n^{th}$ and $n^{th}+1$ metal levels terminate and are connected by a via that is adjacent to the end of each interconnect line. The isolated symmetric termination structures are placed adjacent to the end of each terminated line. In FIG. 2(a), metal interconnect line 100 is an example of an $n^{th}$ line and interconnect line 130 is an example of an $n^{th}+1$ line. The via 120 connects the lines 100 and 130 at the terminated ends and the isolated symmetric termination structures 110 and 140 are placed at the end of each terminated line.

Figure 2B:
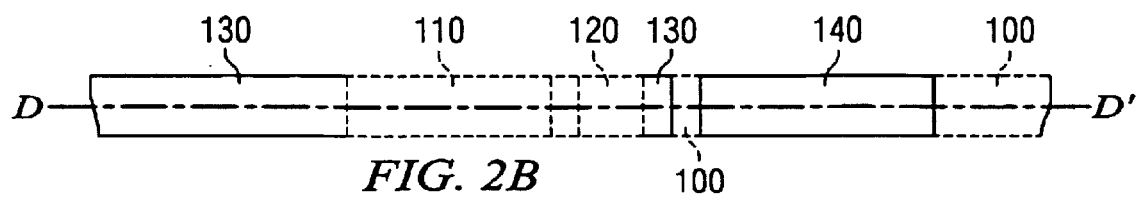
FIG. 2(b) is a top view of the embodiment of the instant invention shown in FIG. 2(a).

Shown in FIG. 2(b) is a top view of the structure of FIG. 2(a). The first copper metal line 100 is shown to be on the same axis DD' as the corresponding isolated symmetric copper structure 110. In the embodiment shown in the Figure, the second isolated symmetric copper structure 140 is on the same axis as the second copper interconnect line 130. In this embodiment the axis' of the first and second copper lines 100 and 130 are coincident (it should be noted that the axis' are on different planes). This in not to be taken as a limitation of the instant invention and shown in FIG. 3 is a further embodiment where the axis of the various copper lines are not coincident.

Figure 3:
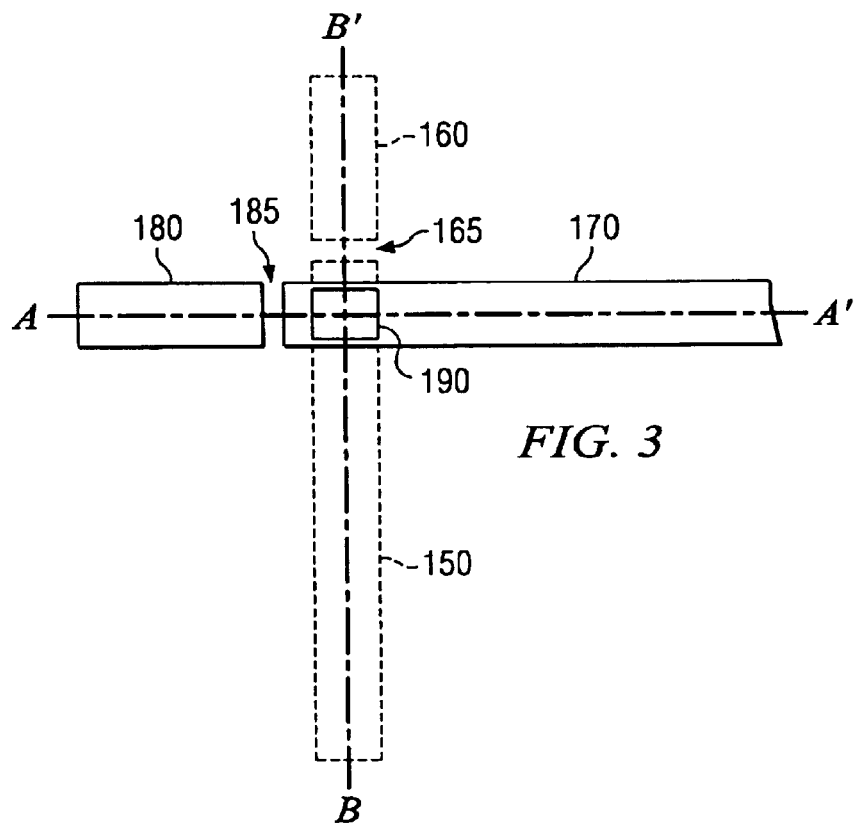
FIG. 3 is a top view of a further embodiment of the instant invention.

In FIG. 3, copper interconnect lines from two different levels are shown as 150 and 170. The metal lines are connected with the via 190. The axis of the copper interconnect line 170 is given by AA' and can be described by a line that is drawn perpendicular to the end 185 of the line 170 that is adjacent to the connecting via 190. The isolated copper symmetric structure 180 associated with the interconnect line 170 is then placed along the axis AA' at a distance of less than 0.5 um from the end of the line. In a similar manner the axis BB' of the second copper interconnect line 150 can be described by a line BB' that is drawn perpendicular to the end 165 of the copper interconnect line 150 that is adjacent to the connecting via 190. The isolated copper symmetric structure 160 associated with the interconnect line 150 is then placed along the axis BB' at a distance of less than 0.5 um from the end of the line 165.

Figure 4A:
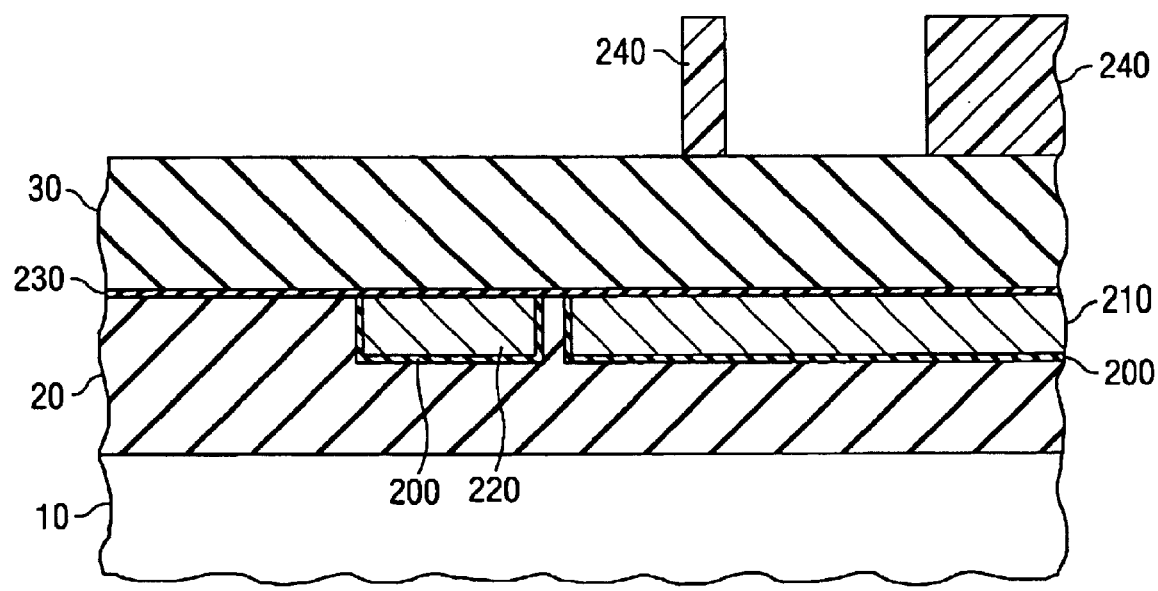
FIG. 4(a) to FIG. 4(c) are cross-sectional diagrams showing the formation of an embodiment of the instant invention.
Figure 4B:
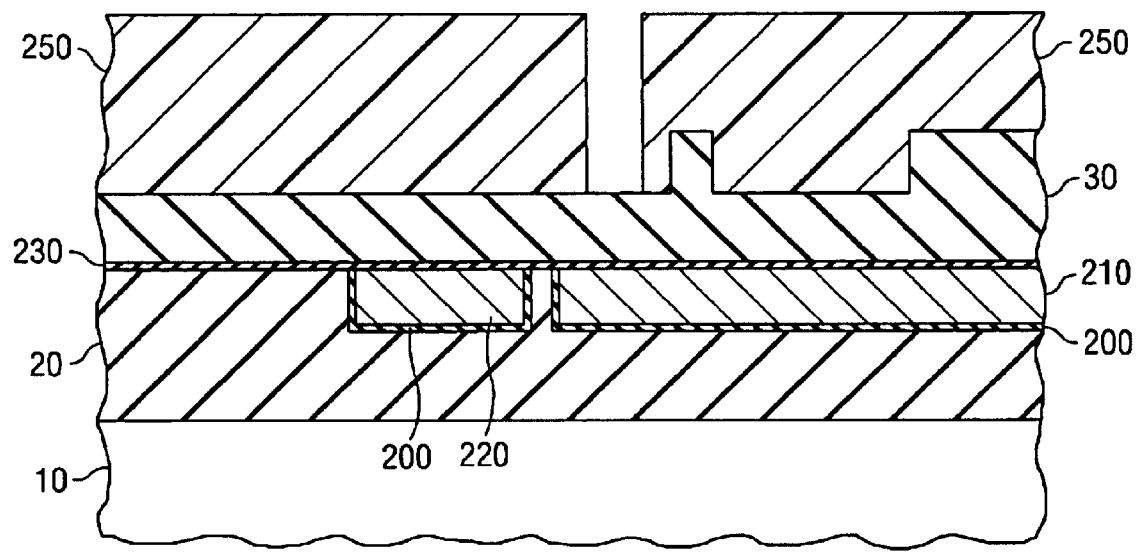
Figure 4C:
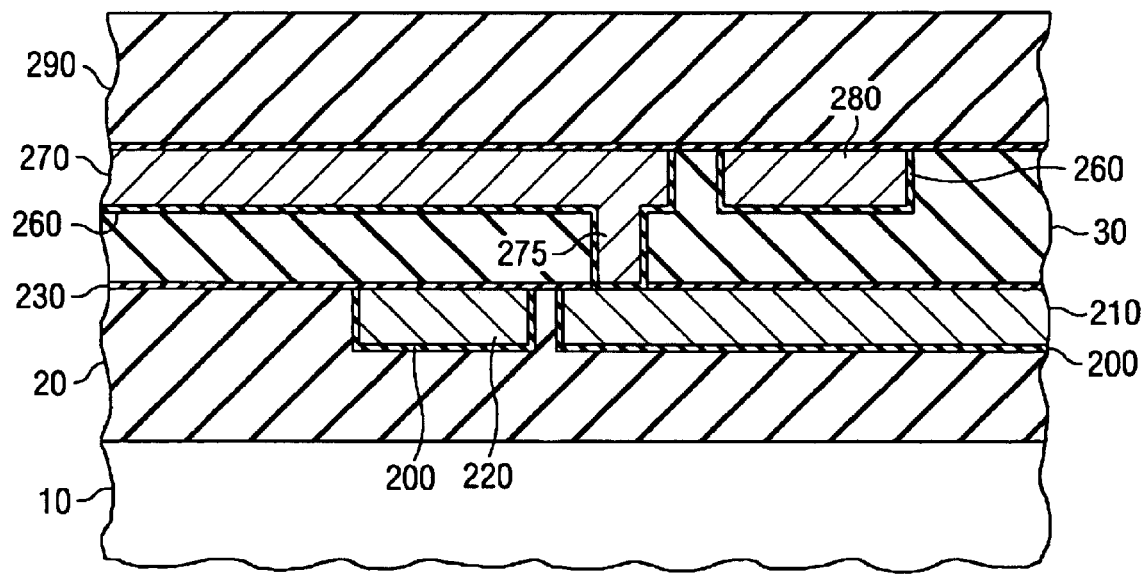

Shown in FIG. 4(a) to FIG. 4(c) are cross-sectional diagrams illustrating a method for forming copper interconnect structures with reduced stress according to the instant invention. As shown in FIG. 4(a), a low k dielectric layer 20 is formed over a semiconductor 10. In an embodiment the low k dielectric 20 can comprise siloxane, silsesquioxanes, cage silsesquioxanes, xerogels, organosilicate glass and other suitable low k dielectric materials with dielectric constants less than 3.8. Any number of intervening layers can be formed between the semiconductor 10 and the first low k dielectric layer 20. Trenches are formed in the dielectric layer 20 and a barrier layer 200 is formed in the trenches. In an embodiment the barrier layer comprises tantalum nitride. Copper is formed in the trenches to form the interconnect line 210 and the isolated symmetric termination structure 220. Following chemical mechanical polishing and any other necessary processes, a barrier layer 230 is formed. In an embodiment the barrier layer 230 comprises silicon nitride. A second low k dielectric layer 30 is formed over the existing low k dielectric layer 20. In an embodiment the low k dielectric 30 can comprise siloxane, silsesquioxanes, cage silsesquioxanes, xerogels, organosilicate glass and other suitable low k dielectric materials with dielectric constants less than 3.8. Patterned photoresist is formed on the second dielectric layer that will be used to etch trench structures in the second low k dielectric layer 30.

Following the etching of the trench structures shown in FIG. 4(b), the remaining photoresist is removed and a new patterned layer of photoresist 250 is formed. This new layer of photoresist 250 will be used to define the via in the dielectric layer 30. Following the etching of the via, the photoresist layer 250 is removed and a barrier 260 is formed in the trench and the via. In an embodiment the barrier 260 comprises tantalum nitride. Following the formation of the barrier 260, copper is formed in the remaining trench structure to form the interconnect line 270, the via 275 and the symmetric termination structure 280. The interconnect line 270 is connected to the underlying interconnect line 210 by the via 275. Additional dielectric and other layers 290 can be formed above the copper interconnect structure.

While this invention has been described with reference to illustrate embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit interconnect structure, comprising:
    a first terminated metal interconnect line;
    a second terminated metal interconnect line connected to said first terminated metal interconnect line by a via;
    a first isolated symmetric termination structure adjacent to said first terminated metal line, and
    a second isolated symmetric termination structure adjacent to said second terminated metal interconnect line.

2. The interconnect structure of claim 1 wherein said first isolated termination structure is separated from said first terminated metal interconnect line by less than 0.5 um.

3. The interconnect structure of claim 2 wherein said second isolated termination structure is separated from said second terminated metal interconnect line by less than 0.5 um.

4. The interconnect structure of claim 3 wherein said first terminated metal interconnect line and said first isolated termination structure lie along a first similar axis.

5. The interconnect structure of claim 4 wherein said second terminated metal interconnect line and said second isolated termination structure lie along a second similar axis.

6. An integrated circuit copper interconnect, comprising:

an asymmetric copper interconnect structure comprising a first terminated interconnect line lying on a first axis and a second terminated interconnect line lying on a second axis;

a first isolated copper symmetric termination structure lying on said first axis and separated from said first terminated interconnect line by less than 0.5 um; and a second isolated copper symmetric termination structure lying on said second axis and separated from said second terminated interconnect line by less than 0.5 um.

7. The integrated circuit copper interconnect of claim 6 wherein said first axis is coincident with said second axis.

8. The integrated circuit copper interconnect of claim 6 wherein said fist axis is not coincident with the second axis.

9. A method for forming a copper integrated circuit interconnect structure, comprising:

forming a first copper terminated metal interconnect line and a first isolated symmetric copper termination structure in a first low k dielectric layer;

forming a second copper terminated metal interconnect line and a second isolated symmetric copper termination structure in a second low k dielectric layer; and forming a via to connect said first copper terminated metal interconnect to said second copper terminated metal interconnect.

10. The method of claim 9 wherein said first isolated symmetric copper termination structure is formed less than 0.5 um from said first copper terminated metal interconnect line.

11. The method of claim 10 wherein said second isolated symmetric copper termination structure is formed less than 0.5 um from said second copper terminated metal interconnect line.

* * * * *